United States Patent [19]

Miyatake

[11] Patent Number: 4,748,486

[45] Date of Patent: May 31, 1988

[54] SOLID-STATE IMAGE SENSOR

[75] Inventor: Shigehiro Miyatake, Osaka, Japan

[73] Assignee: Sharp Kabushiki Kaisha, Osaka, Japan

[21] Appl. No.: 769,924

[22] Filed: Aug. 27, 1985

[30] Foreign Application Priority Data

Aug. 27, 1984 [JP] Japan .................. 59-180209

[51] Int. Cl.[4] ........................... H01L 27/14
[52] U.S. Cl. .................... 357/30 V; 357/24
[58] Field of Search ............ 357/24 LR, 30, 30 I, 357/30 G

[56] References Cited

U.S. PATENT DOCUMENTS 3,995,302 11/1976 Amelio .
4,117,514 9/1978 Terui et al. .
4,373,167 2/1983 Yamada .
4,527,182 7/1985 Ishihara ............... 357/24 LR
4,672,455 6/1987 Miyatake .

FOREIGN PATENT DOCUMENTS 2054961 2/1981 United Kingdom .

OTHER PUBLICATIONS

IEEE International Solid State Circuits Conference, vol. 25, 11th Feb., 1982, pp. 168–169, 134, New York, US, "Interline CCD Image Sensor with an Anti-Blooming Structure", Y. Ishihara et al.
European Search Report, No. EP 85 30 5934, Berlin, 7/28/86, Pretzel.
IEEE Transactions on Electron Devices, vol. ED-29, No. 12, Dec. 1982, pp. 1857–1862, "Blooming Characteristics of a Solid–State Imager Overlaid with a Photoconductor", T. Chikamura et al.
Patent Abstracts of Japan, vol. 9, No. 219, (M-410), (1942), Sep. 6, 1985.

Primary Examiner—Martin H. Edlow
Attorney, Agent, or Firm—Birch, Stewart, Kolasch & Birch

[57] ABSTRACT

A solid-state image sensor having a plurality of unit cells, each of which comprises a substrate; an electroconductive layer formed on the substrate and having a different polarity from the polarity of the substrate; a photoelectric conversion area for the generation of a signal charge when illumination of the photoelectric conversion area is attained; and a CCD register area for the transfer of the signal charge generated in the photoelectric conversion area, the photoelectric conversion area and the CCD register area being formed with a space therebetween within said electroconductive layer at substantially the same distance from the substrate, resulting in a complete depletion of each of the regions of the electroconductive layer, in which the photoelectric conversion area and the CCD register area are positioned, respectively, by the application of a reverse bias voltage between the electroconductive layer and the substrate to thereby attain the transfer of the excess charge generated in the photoelectric conversion area not only from the photoelectric conversion area into the substrate but also from the CCD register area into the substrate through the corresponding depleted regions of the electroconductive area.

9 Claims, 3 Drawing Sheets

SOLID-STATE IMAGE SENSOR

BACKGROUND OF THE INVENTION

1. Field of the Invention

This invention relates to a solid-state image sensor such as an interline CCD image sensor (an interline charge coupled device image sensor) having an antiblooming structure, in which a vertical CCD register constituting a signal charge transfer area is formed independently from a photoelectric conversion area.

2. Description of the Prior Art

In order to suppress blooming resulting from excess charge based on intense illumination of a photoelectric conversion area, a solid-state image sensor in which the photoelectric conversion area is formed within a p-type layer positioned on an n-type layer, has been proposed by Y. Ishihara, et al., "Interline CCD Image Sensor with an Antiblooming Structure," IEEE Transactions on Electron Devices, vol. ED-31, No. 1, pp. 83–88, January 1984. FIG. 4 shows a unit cell constituting the solid-state image sensor disclosed in the above-mentioned article, wherein an n-type layer 1 which constitutes a photoelectric conversion area is formed as a photodiode on a thin p-type layer 5, while another n-type layer 2 which is positioned at a certain distance from the n-type layer 1 is formed on a thick p-type layer 6 and functions as a buried channel of a vertical CCD register. Both the p-type layers 5 and 6 are positioned on an n-type substrate 7. A reverse bias voltage $V_{SUB}$ 8 is applied between the p-type layers 5 and 6 and the substrate 7. This unit cell is electrically isolated from adjacent unit cells by channel stops composed of p+-layers 3. According to the above-mentioned structure, the thin p-type layer 5 is completely depleted, while the thick p-type layer 6 is not sufficiently depleted (namely, the thick p-type layer 6 has a non-depletive region). On both the n-type layer 2 forming the buried channel and the transfer gate region 9 containing the remaining p-type layer which has not undergone depletion, an insulating film 10 and a polysilicon layer 11 constituting an electrode for the vertical CCD register are successively formed. On the electrode 11, a photo-shielding Al film 12 is formed. Pulses $\phi v$ are fed to the electrode 11 to drive the vertical CCD register.

FIGS. 5(a) and 5(c), respectively show the potential profiles in the depth of the vertical CCD register area 2 in a section A in FIG. 4 and the depth of the photodiode area 1 in a section C shown in FIG. 4, and FIG. 5(b) shows the potential profile in the horizontal direction of the vertical CCD register area 2, the transfer gate region 9 and the photodiode area 1, respectively.

The pulse $\phi v$ have three levels, $V_H$ (high), $V_M$ (middle) and $V_L$ (low). A signal charge accumulated in the photodiode area 1 at the time when the pulses $\phi v$ are at the $V_H$ level is transferred into the vertical CCD register area 2 through the transfer gate region 9, and the potential of the photodiode area 1 reaches an equal level to that of the transfer gate region 9 (See solid lines in FIG. 5(a) and 5(c)).

When the pulses $\phi v$ are between the $V_M$ and $V_L$ levels, the vertical CCD register area 2 is isolated from the photodiode area 1 by the transfer gate region 9. At that time, the signal charge in the vertical CCD register area 2 is transferred bit by bit during horizontal flyback, while an additional photogenerated signal charge is accumulated into the photodiode area 1. As the photogenerated signal charge is integrated into the photodiode, the photodiode potential decreases. Excess charge generated at the time when intense illumination is attained in the photodiode area 1 is transferred from the photodiode area 1 into the substrate 7, as indicated by the dotted line in FIG. 5(c) illustrating the photodiode potential, resulting in a suppression of blooming.

However, the conventional solid-state image sensor shown in FIG. 4 has the following disadvantages:

Even where the signal charge in the photodiode area 1 is transferred into the vertical CCD register 2 at the time when the pulses $\phi v$ are at the highest potential $V_H$, an additional signal charge is successively generated and successively transferred from the photodiode 1 into the vertical CCD register 2, as indicated by the solid arrows in FIGS. 5(b) and 5(c), whtout undergoing accumulation into the photodiode 1. Thus, when intense illumination of the photodiode 1 is attained, the excess charge which is generated in the photodiode 1 and successively transferred into the vertical CCD register 2 overflows in the vertical CCD register 2, causing blooming.

SUMMARY OF THE INVENTION

The solid-state image sensor of this invention which overcomes the above-discussed and numerous other disadvantages and deficiencies of the prior art, has a plurality of unit cells, each of which comprises a substrate; and electroconductive layer formed on said substrate and having a different polarity from the polarity of said substrate; a photoelectric conversion area for the generation of a signal charge when illumination of the photoelectric conversion area is attained; and a CCD register area for the transfer of the signal charge generated in said photoelectric conversion area, wherein the photoelectric conversion area and the CCD register area are formed with a space therebetween within the electroconductive layer at substantially the same distance from the substrate, resulting in a complete depletion of each of the regions of the electroconductive layer, in which the photoelectric conversion area and the CCD register area are positioned, respectively, by the application of a reverse bias voltage between the electroconductive layer and the substrate to thereby attain the transfer of the excess charge generated in the photoelectric conversion area not only from the photoelectric conversion area into the substrate but also from the CCD register area into the substrate through the corresponding depleted regions of the electroconductive area.

The upper portion of the photoelectric conversion area and the upper portion of the CCD register area are, in a preferred embodiment, covered with an insulating film.

The upper portion of the photoelectric conversion area has, in a preferred embodiment a photoconductive film thereon which is extended to the upper portion of the CCD register area, resulting in an enlarged photosensitive portion of the photoelectric conversion area.

The CCD register area is, in a preferred embodiment, a vertical CCD register area.

Thus, the invention described herein makes possible the objects of (1) providing a solid-state image sensor which attains a complete suppression of blooming; (2) providing a solid-state image sensor in which at least the region of an electroconductive layer positioned below the vertical CCD register area is completely depleted by the application of a reverse bias voltage between the electroconductive layer and the substrate positioned below the electroconductive layer and having a different polarity from the polarity of the electroconductive layer, so that excess charge, which is generated in the photodiode area due to an extremely intense illumination thereof and successively transferred from the photodiode area into the vertical CCD register area, can be transferred from the vertical CCD register area into the substrate through the depleted electroconductive layer, resulting in a complete suppression of blooming even when extremely intense illumination arises on the photodiode; and (3) providing a solid-state image sensor having an enlarged photosensitive portion of the photoelectric conversion area.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

A feature of this invention is that the regions of an electroconductive layer (e.g., p-type layer) positioned not only below a photoelectric conversion area but also below a vertical CCD register are completely depleted by the application of a reverse bias voltage between the p-type layer and the n-type substrate positioned below the p-type layer, so that excess charge, which is generated in the photodiode area due to an extremely intense illumination thereof, is transferred not only from the photodiode area into the n-type substrate but also from the vertical CCD register area into the substrate through the corresponding depleted regions of the p-type layer, thereby attaining a complete suppression of blooming.

Figure 1:
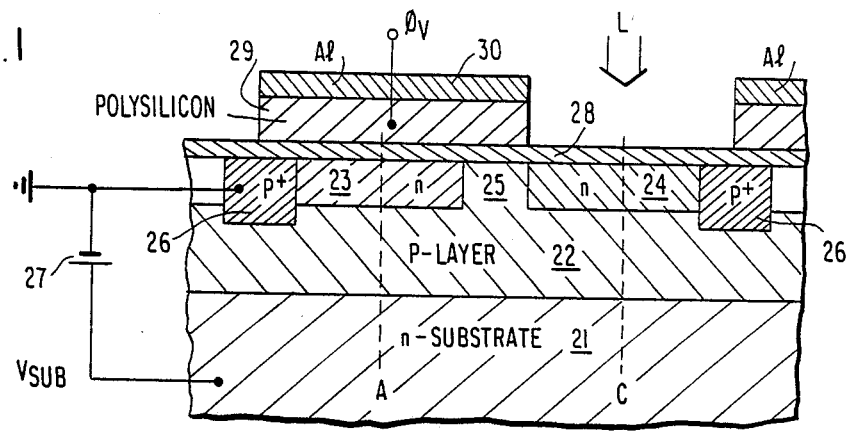
FIG. 1 is a sectional view showing a unit cell of the solid-state image sensor of this invention.

FIG. 1 shows a unit cell of the solid-state image sensor of this invention, which comprises an n-type silicon substrate 21, a p-type layer 22 formed on the n-type substrate 21, n-type layers 23 and 24, constituting the buried channel of a vertical CCD register area and the photoelectric conversion area including a photosensitive area composed of a p-n junction photodiode, respectively, which are formed on the p-type layer 22, and a transfer gate region 25, containing the part of the p-type layer 22 which has not undergone depletion, which is positioned between the n-type layers 23 and 24. This unit cell is designed to be electrically isolated from the adjacent unit cells by channel stops 26 each of which is composed of a p+-layer formed in the surroundings thereof.

On the n-type layer 23 and the transfer gate region 25, a polysilicon electrode 29 constituting an electrode for the vertical CCD register area is disposed, through an insulating film 28, to which pulses $\phi v$ are fed to drive the vertical CCD register area. On the electrode 29, an Al film 30 is further disposed as a photo-shield. A reverse bias voltage ($V_{SUB}$)27 is applied between the channel stops 26 and the substrate 21 such that the p-type layer 22 can be completely depleted. Since the sensor of this invention is designed such that not only the ntype layer 24 constituting the photodiode area but also the n-type layer 23 constituting the buried channel are formed within the p-type layer 22 at substantially the same distance from the substrate 21, respectively, the region of the p-type layer positioned below the vertical CCD register, as well as the region of the p-type layer positioned below the photodiode area, can be completely depleted.

Figure 2A:
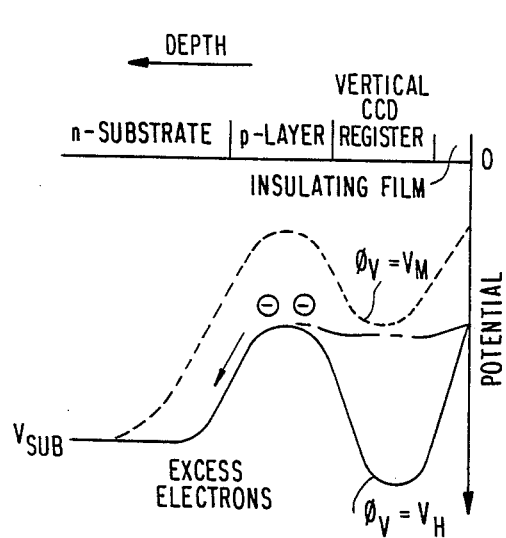
FIGS. 2(a), 2(b) and 2(c), respectively, are curves illustrating the potential profiles in the depth of the vertical CCD register area, the horizontal direction of the vertical CCD register area and the depth of the photodiode area of the sensor shown in FIG. 1.
Figure 2B:
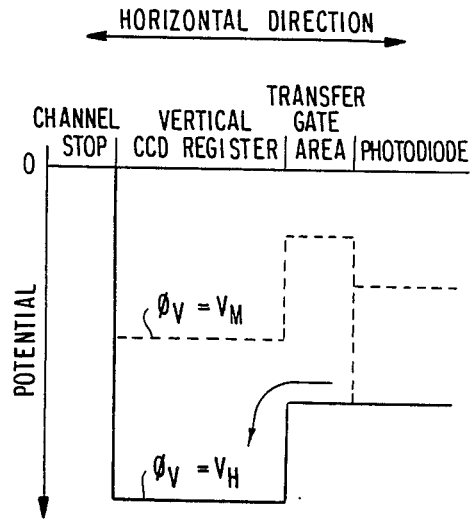
Figure 2C:
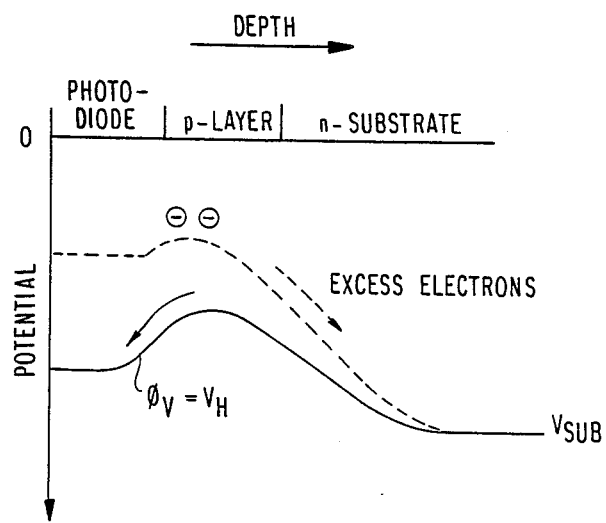

FIGS. 2(a) and 2(c), respectively, show the potential profiles in the depth of the vertical CCD register area in the section A shown in FIG. 1 and the depth of the photodiode area in the section C shown in FIG. 1. FIG. 2(b) shows the potential profile in the horizontal direction of the vertical CCD register area 23, the transfer gate region 25 and the photodiode area 24, respectively. The pulses $\phi v$ have three levels, $V_H$ (high), $V_M$ (middle) and $V_L$ (low). When the pulses $\phi v$ are at the $V_H$ level, a signal charge accumulated in the photodiode area 24 is transferred into the vertical CCD register area 23 through the transfer gate region 25, and the potential of the photodiode area 24 results in an equal level to that of the transfer gate region 25 (See the solid lines in FIGS. 2(b) and 2(c)).

When the pulses $\phi v$ are between the $V_M$ and $V_L$ levels, the vertical CCD register area 23 is isolated from the photodiode area 24 by the transfer gate region 25. At that time, the signal charge in the vertical CCD register area 23 is transferred bit by bit during horizontal flyback, while an additional photogenerated signal charge is accumulated into the photodiode area 24. As the photogenerated signal charge is integrated into the photodiode area 24, the potential of the photodiode area 24 decreases. Excess charge generated at the time when an intense illumination is attained in the photodiode area 24 is transferred from the photodiode area 24 into the substrate 21, as indicated by the dotted line in FIG. 2(c), resulting in a suppression of blooming.

Moreover, even where the signal charge in the photodiode area 24 is transferred into the vertical CCD register area 23 at the time when the pulses $\phi v$ are at the $V_H$ level, the additional signal charge is successively generated and transferred into the vertical CCD register area 23, as indicated by the solid arrows in FIGS. 2(b) and 2(c), without undergoing accumulation into the photodiode area 24. Thus, when an extremely intense illumination is attained in the photodiode area 24, the signal charge generated therein fills the well of the vertical CCD register area 23 as indicated by the dotted and dashed line in FIG. 2(a). In addition, since the region of the p-type layer positioned below the vertical CCD register area 23 is completely depleted, excess charge exceeding the abovementioned potential level can be transferred from the vertical CCD register area 23 into the substrate 21 through the depleted p-type layer below the vertical CCD register area 23 as indicated by the solid arrow in FIG. 2(a), resulting in a complete suppression of blooming.

Figure 3:
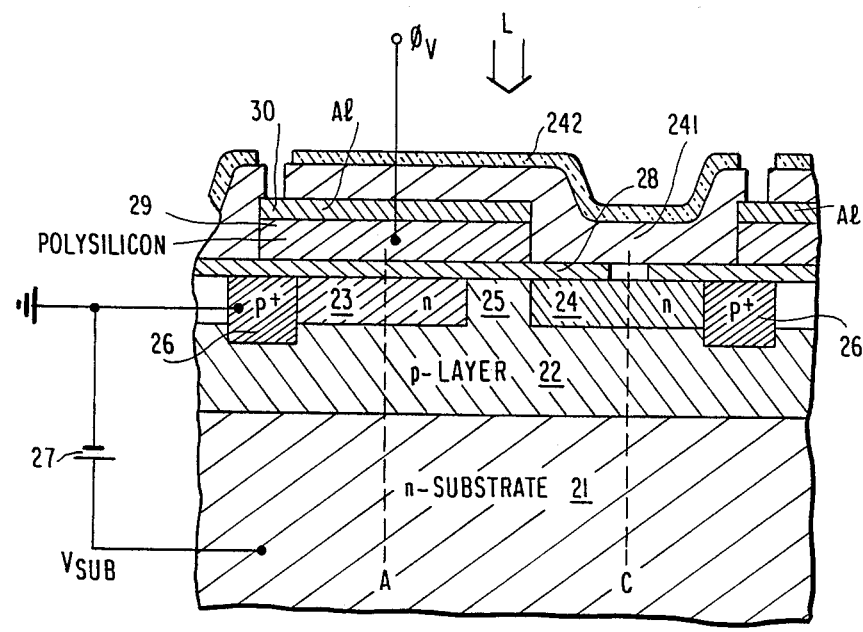
FIG. 3 is a sectional view showing another unit cell of the solid-state image sensor of this invention.
Figure 4:
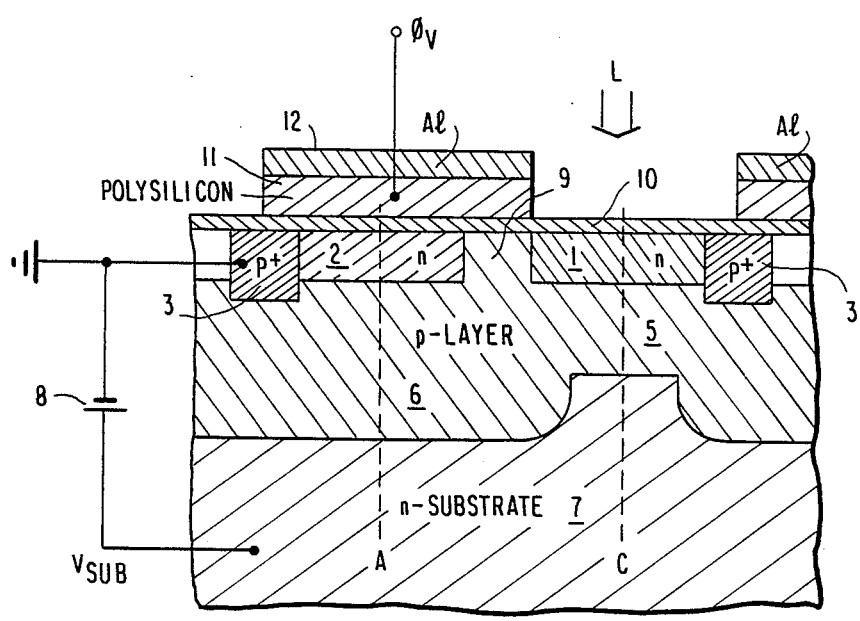
FIG. 4 is a sectional view showing a conventional solid-state image sensor.
Figure 5A:
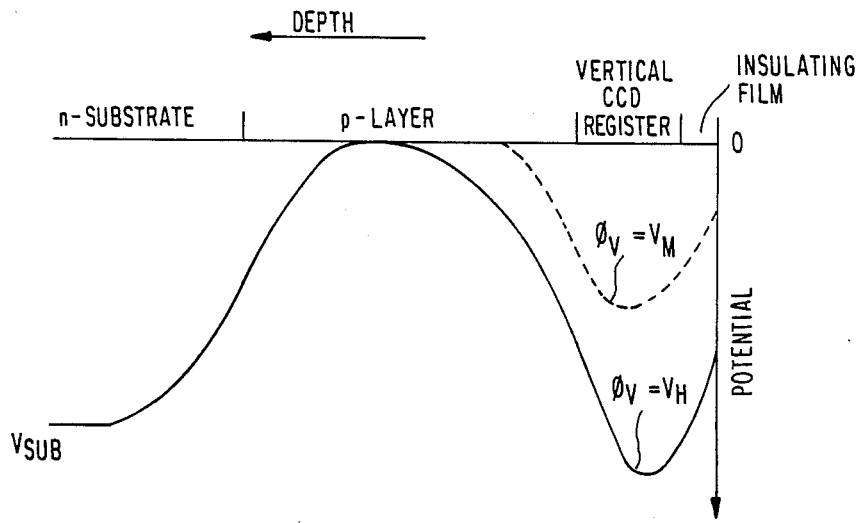
FIGS. 5(a), 5(b) and 5(c), respectively, are curves illustrating the potential profiles in the depth of the vertical CCD register area, the horizontal direction of the vertivcal CCD register area and the depth of the photodiode area of the sensor shown in FIG. 4.
Figure 5B:
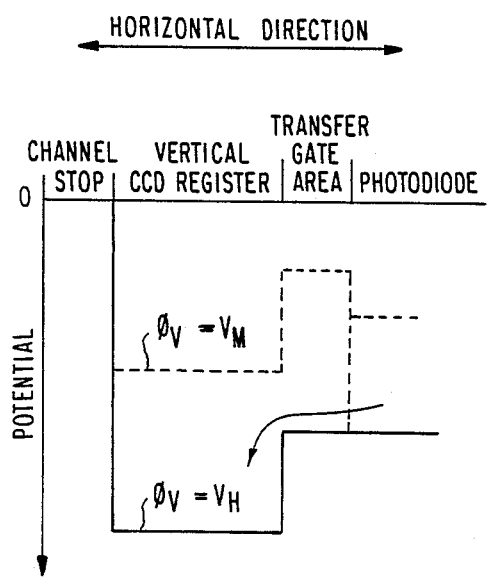
Figure 5C:
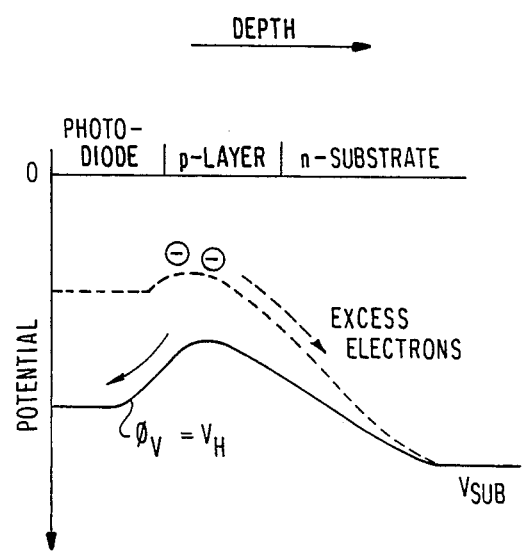

Although only the interline CCD image sensor is described in the above-mentioned example shown in FIG. 1, the solid-state image sensor intended in this invention is not limited thereto. Another solid-state image sensor having such a structure as shown in FIG. 3, in which the upper portion of the photoelectric conversion area 24 has a photoconductive film 241 thereon extended to the upper portion charge transfer area 23 including the CCD register resulting in an enlarged photosensitive portion of the photoelectric conversion area, can be included. The photoconductive film 241 is covered by a light-permeable electrode 242.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A solid-state image sensor having a plurality of unit cells, each of said unit cells comprising:
   a substrate;
   an electroconductive layer formed on said substrate having a polarity different from the polarity of said substrate;
   a photoelectric conversion area formed within a first region of said electroconductive layer for generating a signal charge when illumination of said photoelectric conversion area is attained; and
   a CCD register area formed within a second region of said electroconductive layer for transferring the signal charge generated in said photoelectric conversion area,
   wherein said photoelectric conversion are and said CCD register area are formed with a third region of said electroconductive layer therebetween and are formed substantially the same distance from said substrate, and
   wherein said first and second regions of said electroconductive layer are completely depleted by the application of a reverse bias voltage between said electroconductive layer and said substrate so as to form first and second depleted regions, said first and second depleted regions providing for the transfer of excess charge generated in said photoelectric conversion area from said photoelectric conversion area into said substrate and also from said CCD register area into said substrate.

2. A solid-state image sensor according to claim 1, wherein an insulating film is formed on said photoelectric conversion area and on said CCD register area.

3. A solid-state image sensor according to claim 1, wherein a photoconductive film is formed on said photoelectric conversion area and on said CCD register area so as to enlarge the photosensitve portion of said photoelectric conversion area.

4. A solid-state image sensor according to claim 1, wherein said CCD register area is a vertical CCD register area.

5. A solid-state image sensor according to claim 1, wherein an electrode is formed on said insulating film and wherein an aluminum film is formed on said electrode.

6. A solid-state image sensor according to claim 5, wherein a photoconductive film is formed on said insulating film and on said aluminum film so as to enlarge the photosensitive portion of said photoelectric conversion area, and wherein a light-permeable electrode is formed on said photoconductive film.

7. A solid-state image sensor according to claim 1, wherein channel stops are formed in said electroconductive layer to electrically isolate each of said unit cells from adjacent unit cells.

8. A solid-state image sensor according to claim 5, wherein said substrate is an n-type silicon substrate, said electroconductive layer is a p-type layer, said CCD register is an n-type layer which comprises a buried channel of a vertical CCD register area, said photoelectric conversion area is a p-n junction photodiode, and said third region is a transfer gate region.

9. A solid-state image sensor according to claim 6, wherein said substrate is an n-type silicon substrate, said electroconductive layer is a p-type layer, said CCD register is an n-type layer which comprises a buried channel of a vertical CCD register area, said photoelectric conversion area is a p-n junction photodiode, and said third region is a transfer gate region.

* * * * *